United States Patent [19]

Lue et al.

[11] Patent Number: 5,207,866

[45] Date of Patent: May 4, 1993

[54] ANISOTROPIC SINGLE CRYSTAL SILICON ETCHING SOLUTION AND METHOD

[75] Inventors: Ping-Chang Lue; Henry G. Hughes, both of Scottsdale, Ariz.

[73] Assignee: Motorola, Inc., Schaumburg, Ill.

[21] Appl. No.: 642,592

[22] Filed: Jan. 17, 1991

[51] Int. Cl.$^5$ ............................................. H01L 21/00
[52] U.S. Cl. ................................... 156/647; 156/649; 156/662; 252/79.5; 252/79.1; 204/129.1; 204/129.95
[58] Field of Search ...................... 156/647, 649, 662; 252/79.5, 79.1; 204/129.1, 129.75

[56] References Cited

U.S. PATENT DOCUMENTS

| | | | |
|---|---|---|---|
| 4,047,184 | 9/1977 | Bassous et al. | 156/661.1 |
| 4,172,005 | 10/1979 | Muraoka et al. | 156/647 |
| 4,339,340 | 7/1982 | Muraoka et al. | 156/647 |
| 4,428,111 | 1/1984 | Swartz | 156/647 |
| 4,765,865 | 8/1988 | Gealer et al. | 156/647 |
| 4,808,549 | 2/1989 | Mikkor et al. | 156/647 |
| 4,966,649 | 10/1990 | Harada et al. | 156/647 |

FOREIGN PATENT DOCUMENTS 3805752  8/1989  European Pat. Off. .

*Primary Examiner*—Brian E. Hearn
*Assistant Examiner*—George Goudreau
*Attorney, Agent, or Firm*—Harry A. Wolin

[57] ABSTRACT

A method of anisotropically etching single crystal silicon includes providing single crystal silicon to be etched and placing it in an etching solution consisting essentially of $R_4NOH$ and solvent wherein R is an alkyl group having between 0 and 4 carbon atoms. The solution will preferentially etch <100> or <110> oriented single crystal silicon. Additionally, electrochemical etching may be employed to preferentially etch P type single crystal silicon.

8 Claims, No Drawings

ANISOTROPIC SINGLE CRYSTAL SILICON ETCHING SOLUTION AND METHOD

FIELD OF THE INVENTION

This invention relates, in general, to etching solutions and methods and more particularly to an anisotropic etching solution and method for single crystal silicon.

BACKGROUND OF THE INVENTION

Semiconductor device processing and other arts require the etching of single crystal silicon both isotropically and anisotropically. Anisotropic etchants and etching solutions are required to preferentially etch material of specific crystallographic orientation and/or conductivity type. Anisotropic etching is commonly performed both chemically and electrochemically.

Well known anisotropic chemical etchants for single crystal silicon include aqueous solutions of potassium hydroxide (KOH), sodium hydroxide (NaOH) and lithium hydroxide (LiOH). Although these solutions are sufficient for many applications, they each have an $Si/SiO_2$ selectivity ratio only on the order of 400:1. Further, they are not particularly clean solutions in terms of ionic contamination.

Aqueous cesium hydroxide (CsOH) solution is a relatively good single crystal silicon etchant. Cs has the largest cation size of all the alkaline metals and therefore has many good properties. CsOH solution has a relatively fast etch rate and its $Si/SiO_2$ selectivity ratio is on the order of 3000:1. However, CsOH is very expensive and therefore, impractical.

Other well known single crystal silicon etchants include the aqueous solutions of hydrazine ($H_2N$-$NH_2$), ethylenediamine/pyrocatechol ($H_2N$-$CH_2CH_2$-$NH_2$/$C_6H_4(OH)_2$), the latter commonly being employed electrochemically. Ethylenediamine/pyrocatechol solution is an excellent etchant in that it has a relatively fast etch rate and a $Si/SiO_2$ selectivity ratio on the order of 4000:1. Additionally, hydrazine, ethylenediamine and ethylenediamine/pyrocatechol solutions are fairly clean etchants leaving relatively few ionic contaminants. However, these etchants are extremely hazardous and difficult to use. Hydrazine is a suspected carcinogen, ethylenediamine is extremely toxic and flammable and pyrocatechol is not environmentally acceptable. For these reasons, hydrazine, ethylenediamine and ethylenediamine/pyrocatechol solutions are extremely difficult to utilize in a manufacturing environment.

In view of the above, it would be highly desirable to have an anisotropic etching solution for single crystal silicon having a fast etch rate, a high $Si/SiO_2$ selectivity ratio and that provides a clean etch in terms of ionic contaminants and etch quality. Additionally, it would be highly desirable to have an etching solution of these qualities which is not a severe fire or health hazard and may be readily used in a manufacturing environment.

SUMMARY OF THE INVENTION

A method of anisotropically etching single crystal silicon includes providing single crystal silicon to be etched and anisotropically etching the silicon with an etching solution consisting essentially of tetraalkylammonium hydroxide ($R_4NOH$) and solvent wherein R is an alkyl group having between 0 and 4 carbon atoms. This solution will preferentially etch <100> and <110> oriented single crystal silicon. When used electrochemically, the solution may preferentially etch P type single crystal silicon.

DETAILED DESCRIPTION OF THE PREFERRED EMBODIMENTS

Single crystal silicon may be anisotropically etched by a solution consisting essentially of tetra-alkylammonium hydroxide ($R_4NOH$) and solvent wherein R is an alkyl group having between 0 and 4 carbon atoms. One of skill in the art will know that $R_4NOH$ wherein R has 0 carbon atoms is ammonium hydroxide ($NH_4OH$). $RH_4OH$ solutions will preferentially etch <100> and <110> oriented single crystal silicon and will not etch <111> oriented single crystal silicon. This solution may also be used electrochemically to preferentially etch P type single crystal silicon of <100> and <110> orientations. The P to N selectivity of this electrochemical etching solution is dependent upon the dopant concentration of the silicon and the voltage applied to the electrochemical bath.

$R_4NOH$ is preferably employed with water as the solvent to comprise the etching solution. However, the solvent may also include surfactants and the like to enhance etch quality. The solution should comprise at least 15% $R_4NOH$ by weight. If less than 15% $R_4NOH$ by weight is employed, the anisotropicity is more dislocated and the etch characteristics are generally rough and non-uniform. Preferably, the $R_4NOH$ etching solution is employed at a temperature of at least 50 degrees centigrade.

The $R_4NOH/H_2O$ etching solution is far superior to other well known single crystal silicon anisotropic etchants. $R_4NOH/H_2O$ provides an extremely clean etch in terms of ionic contamination and etch quality at a relatively fast etch rate. Further, $R_4NOH/H_2O$ solution has an $Si/SiO_2$ selectivity ratio of greater than 4000:1. $R_4NOH/H_2O$ solution is also extremely safe to use in a manufacturing environment. There are no serious flammability, health, environmental or toxicicity problems associated with this solution. Lastly, $R_4NOH/H_2O$ is relatively inexpensive.

Etch rates for $R_4NOH/H_2O$ solutions vary depending on temperature and concentration. $(CH_3)_4NOH/H_2O$ solutions are used here and are exemplary. At 80 degrees centigrade, 15%, 20%, 25% and 50% $(CH_3)_4NOH$ by weight $H_2O$ solutions provided etch rates of 36.8, 32.9, 29.9 and 2.9 micrometers/hour, respectively. At 95 degrees centigrade, 15%, 20%, 25%, 31% and 50% $(CH_3)_4NOH$ by weight $H_2O$ solutions provided etch rates of 74.8, 80.8, 71.4, 49.0 and 10.3 micrometers/hour, respectively. The above etch rates were obtained on a <100> oriented single crystal silicon wafer.

EXAMPLE 1

Tetramethylammonium hydroxide pentahydrate (($CH_3)_4NOH \cdot 5H_2O$) was heated to a temperature of 80 degrees centigrade plus or minus 0.5 degrees. This compound has a melting point in the range of 65 to 68 degrees centigrade and therefore when heated to 80 degrees centigrade, provided a tetramethylammonium hydroxide/water solution. The molecular weight of the tetramethylammonium hydroxide pentahydrate was 181.23 grams which provided 50.2% tetramethylammonium hydroxide by weight (mole fraction of 0.1667) and a water content of 49.8% by weight(mole fraction of 0.8333). A <100> oriented single crystal silicon wafer having a sensor test pattern thereon was dipped in 30 degree centigrade 6:1 HF solution and then rinsed with 10% tetramethylammonium hydroxide by weight water solution. The wafer was then placed in the tetramethylammonium hydroxide solution. The silicon wafer was successfully anisotropically etched during separate time intervals of both 40 minutes and 5 hours. Successful etches were also performed with the same solutions at a temperature of 95 degrees centigrade for the same time intervals.

EXAMPLE 2

Tetramethylammonium hydroxide pentahydrate was melted and additional water was added to provide a solution having a tetramethylammonium hydroxide content of 31.8% by weight and a total water content of 68.2% by weight. The solution was heated to a temperature of 80 degrees centigrade plus or minus 0.5 degrees centigrade. A <100> oriented single crystal silicon wafer having a sensor test pattern thereon was cleaned with a 6:1 HF solution and rinsed with a 10% tetramethylammonium hydroxide by weight water solution. The wafer was then put in the 80 degree centigrade tetramethylammonium hydroxide and water solution. After 40 minutes, the wafer was removed and the etch rate was noticeably faster than in the solution containing 50.2% by weight tetramethylammonium hydroxide. The etch was very clean and excellent anisotropicity was maintained.

Thus it is apparent that there has been provided, in accordance with the invention, an improved method for anisotropically etching single crystal silicon. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. An electrochemical method of anisotropically etching single crystal silicon comprising the steps of:
   providing single crystal silicon to be etched; and
   anisotropically etching said silicon in an electrochemical bath having an etching solution consisting essentially of more than 20% by weight $R_4NOH$ and solvent wherein R is an alkyl group having between 0 and 4 carbon atoms.

2. The method of claim 1 wherein the silicon is preferentially etched in the <100> and <100> crystallographic orientations.

3. The method of claim 1 wherein the solvent comprises $H_2O$.

4. The method of claim 3 wherein P type silicon is preferentially etched.

5. The method of claim 4 wherein the temperature of the etching solution is at least 50 degrees centigrade.

6. An electrochemical method of preferentially etching single crystal silicon having a <100> or <110> crystallographic orientation comprising the steps of:
   providing single crystal silicon having a <100> or <110> crystallographic orientation to be etched; and
   preferentially etching said silicon in an electrochemical bath having an etching solution consisting essentially of $R_4NOH$ and $H_2O$ wherein R is an alkyl group having between 0 and 4 carbon atoms and said solution comprises more than 20% $R_4NOH$ by weight.

7. The method of claim 6 wherein the temperature of the etching solution is at least 50 degrees centigrade.

8. The method of claim 7 wherein P type silicon is preferentially etched.

* * * * *

UNITED STATES PATENT AND TRADEMARK OFFICE
CERTIFICATE OF CORRECTION

PATENT NO. : 5,207,866
DATED : May 4, 1993
INVENTOR(S) : Lue, et al

It is certified that error appears in the above-indentified patent and that said Letters Patent is hereby corrected as shown below:

Column 4, line 13, claim 2, delete the second occurrence of "<100>" and insert therefor —<110>—.

Column 4, line 15, claim 3, delete "1" and insert therefor —2—.

Signed and Sealed this

Twenty-eighth Day of November 1995

Attest:

BRUCE LEHMAN

Attesting Officer

Commissioner of Patents and Trademarks